(12) United States Patent
Lee et al.

(10) Patent No.: US 6,476,652 B1
(45) Date of Patent: Nov. 5, 2002

(54) DELAY LOCKED LOOP FOR USE IN SYNCHRONOUS DYNAMIC RANDOM ACCESS MEMORY

(75) Inventors: Seong-Hoon Lee; Jung-Il Yang, both of Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/703,406

(22) Filed: Oct. 31, 2000

(51) Int. Cl.$^7$ .................................................. H03L 7/00
(52) U.S. Cl. ...................................... 327/158; 327/161
(58) Field of Search .............................. 327/158, 161, 327/262, 263, 264, 270, 271, 272, 276, 277, 278, 281, 284, 288; 331/11, 17

(56) References Cited

U.S. PATENT DOCUMENTS 5,699,003 A * 12/1997 Saeki .......................... 327/161
5,990,714 A * 11/1999 Takahashi .................... 327/158
6,137,328 A * 10/2000 Sung ........................... 327/158
6,259,288 B1 * 7/2001 Nishimura ................... 327/158
6,297,680 B1 * 10/2001 Kondo ......................... 327/278

* cited by examiner

Primary Examiner—Timothy P. Callahan
Assistant Examiner—Linh Nguyen
(74) Attorney, Agent, or Firm—Townsend and Townsend and Crew LLP (57) ABSTRACT

A delay locked loop (DLL) is used to compensate for a skew in a synchronous dynamic random access memory. The delay locked loop includes: a delay model for delaying an external clock signal by the skew to generate a delayed clock signal; a signal generation unit, in response to the external clock signal and the delayed clock signal, for generating control signals; a first delay unit, in response to the control signals, for delaying the delayed control signal to generate a first DLL clock signal, wherein the first delay unit has a large unit delay; and a second delay unit, in response to the control signals, for delaying the first DLL clock signal to generate a second DLL clock signal, wherein the second delay means in a small unit delay.

11 Claims, 12 Drawing Sheets

DELAY LOCKED LOOP FOR USE IN SYNCHRONOUS DYNAMIC RANDOM ACCESS MEMORY

FIELD OF THE INVENTION

The present invention relates to a semiconductor integrated circuit; and, more particularly, to a delay circuit for use in a synchronous dynamic random access memory, which is capable of obtaining a fast locking time and a reduced jitter.

DESCRIPTION OF THE PRIOR ART

For achieving high speed operation in a semiconductor memory device, a synchronous dynamic access memory (SDRAM) has been developed. The SDRAM operates in synchronization with an external clock signal. The SDRAM includes a single data rate (SDR) SDRAM, a double data rate (DDR) SDRAM, and the like.

Generally, when data are output in synchronization with the external clock signal, a skew between the external clock signal and the output data occurs. In the SDRAM, a delay locked loop (DLL) can be used to compensate the skew between an external clock signal and the output data, or an external clock signal and an internal clock signal.

A digital DLL is implemented with a plurality of unit delay elements that are coupled in series. For increasing a resolution, a unit delay time should be minimized. As the unit delay time becomes smaller, however, more unit delay elements are needed. Consequently, power consumption as well as chip size is increased much more.

SUMMARY OF THE INVENTION

It is, therefore, an object of the present invention to provide a delay locked loop which is capable of obtaining a fast locking time and a reduced jitter.

In accordance with an aspect of the present invention, there is provided a delay locked loop for compensating for a skew in a synchronous dynamic random access memory, comprising: a delay model for delaying an external clock signal by the skew to generate a delayed clock signal; a signal generation means, responsive to the external clock signal and the delayed clock signal, for generating control signals; a first delay means, responsive to the control signals, for delaying the delayed control signal to generate a first delay locked clock signal, wherein the first delay means has a large unit delay; and a second delay means, responsive to the control signals, for delaying the first delay locked clock signal to generate a second delay locked clock signal, wherein the second delay means has a small unit delay.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
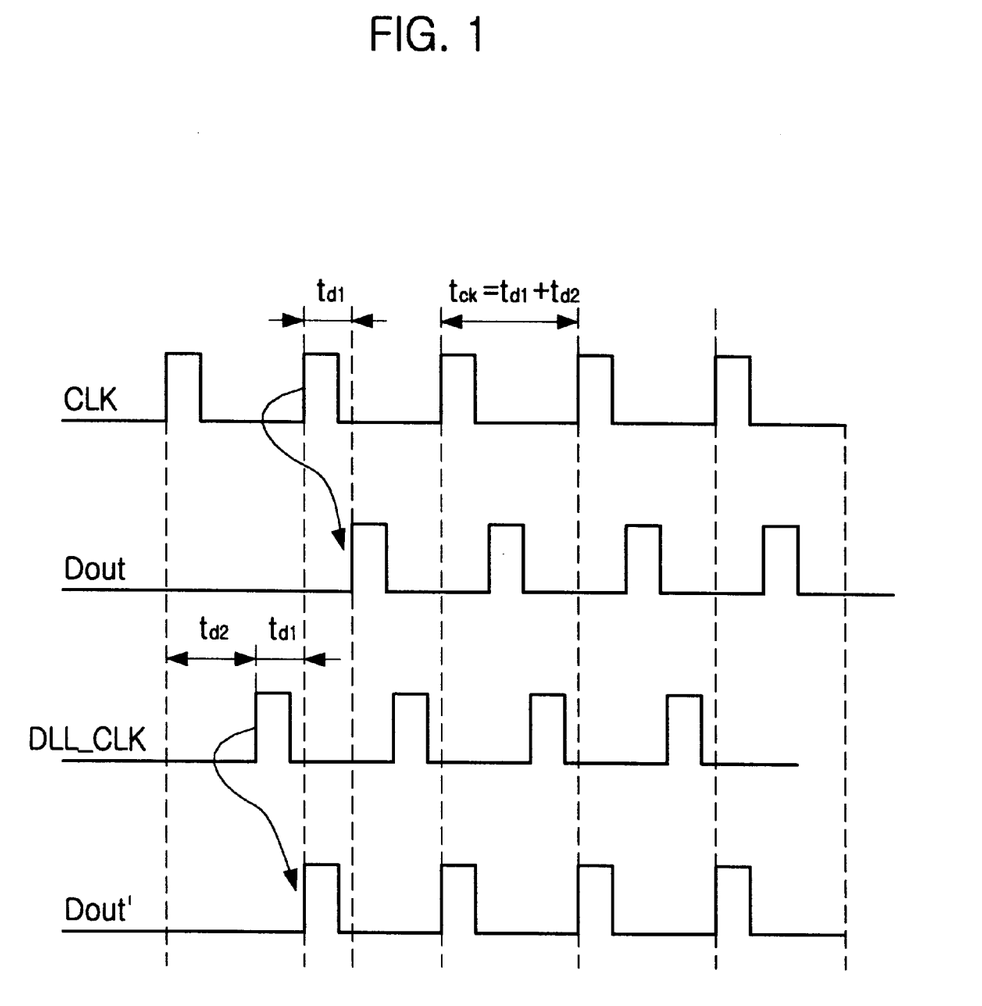
FIG. 1 is a timing chart for explaining a principle of a DLL.

FIG. 1 is a timing chart for explaining a principle of a DLL. Here, $t_{ck}$ denotes a time period of an external clock signal CLK.

As shown, when data is output in synchronization with the external clock signal CLK, a skew $t_{d1}$ between the external clock signal CLK and the output data $D_{out}$ is caused. The skew $t_{d1}$ can be compensated by outputting the data in synchronization with an internal clock signal DLL_CLK that precedes the external clock signal by the skew $t_{d1}$. At this time, the internal clock signal DLL_CLK is obtained by delaying the external clock signal CLK by a predetermined time $t_{d2}$ corresponding to $(t_{ck}-t_{d1})$. This internal clock signal DLL_CLK is referred to as a DLL clock signal. Consequently, if the data is output in synchronization with the DLL clock signal, the output data $D_{out}$ is synchronized with the external clock signal CLK.

Figure 2:
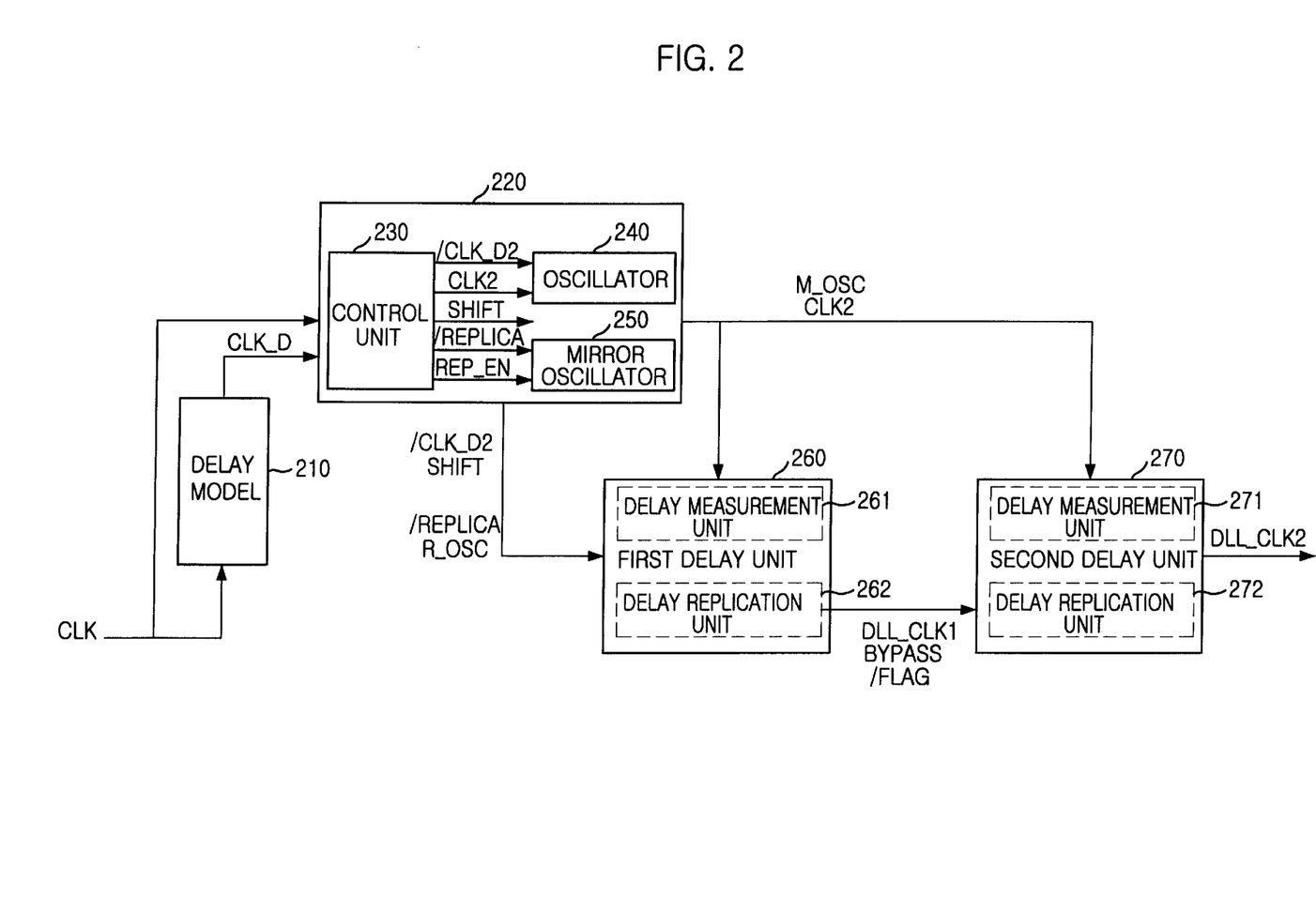
FIG. 2 is a block diagram illustrating a delay circuit in accordance with the present invention.

FIG. 2 is a block diagram illustrating a delay circuit in accordance with the present invention.

Referring to FIG. 2, the delay circuit in accordance with the present invention includes a delay model 210, a signal generation unit 220, a first delay unit 260 and a second delay unit 270.

The delay model 210 delays an external clock signal CLK by a skew $t_{d1}$ between the external clock signal CLK and an output data to generate a delayed clock signal CLK_D.

The signal generation unit 220 includes a control unit 230, an oscillator 240 and a mirror oscillator 250.

The control unit 230 receives the external clock signal CLK and the delayed clock signal CLK_D to generate control signals. The control signals include a control clock signal CLK2, a delayed control signal /CLK_D2, a replication signal /REPLICA and a replication enable signal REP_EN.

Here, the control clock signal CLK2 is enabled to a high level from a first rising edge to a second rising edge of the external clock signal CLK, so that the control clock signal CLK2 has a time period two times as long as the external clock signal CLK. The delayed control signal /CLK2_D2 is enabled to a low level from a first rising edge to a second rising edge of the delayed clock signal CLK_D, so that the delayed control signal /CLK_D2 has a time period two times as long as the delayed clock signal CLK_D.

The replication enable signal REP_EN is used to activate the mirror oscillator 250, and the replication signal /REPLICA is a control signal used to toggle a replication oscillating signal R_OSC.

The oscillator 240 performs an oscillation operation to generate a measurement oscillating signal M_OSC in response to the control clock signal CLK2 and the delayed control signal /CLK_D2. The measurement oscillating signal M_OSC is toggled while both the control clock signal CLK2 and the delayed control signal /CLK_D2 are enabled.

The mirror oscillator 250 performs an oscillation operation to generate a replication oscillating signal R_OSC in response to the replication signal /REPLICA and the replication enable signal REP_EN. The replication oscillating signal R_OSC is toggled while both the replication signal /REPLICA and the replication enable signal REP_EN are enabled.

The first delay unit 260, which has a large unit delay, coarsely delays the external clock signal CLK in response to the control signals and generates a first delay clock signal DLL_CLK1. The first delay unit 260 also includes a first delay measurement unit 261 and a first delay replication unit 262.

The second delay unit 270, which has a small unit delay, finely delays the first delay clock signal DLL_CLK1 in response to the control signals and generates a second delay clock signal DLL_CLK2. The second delay unit 270 also includes a second delay measurement unit 271 and a second delay replication unit 272.

Figure 3:
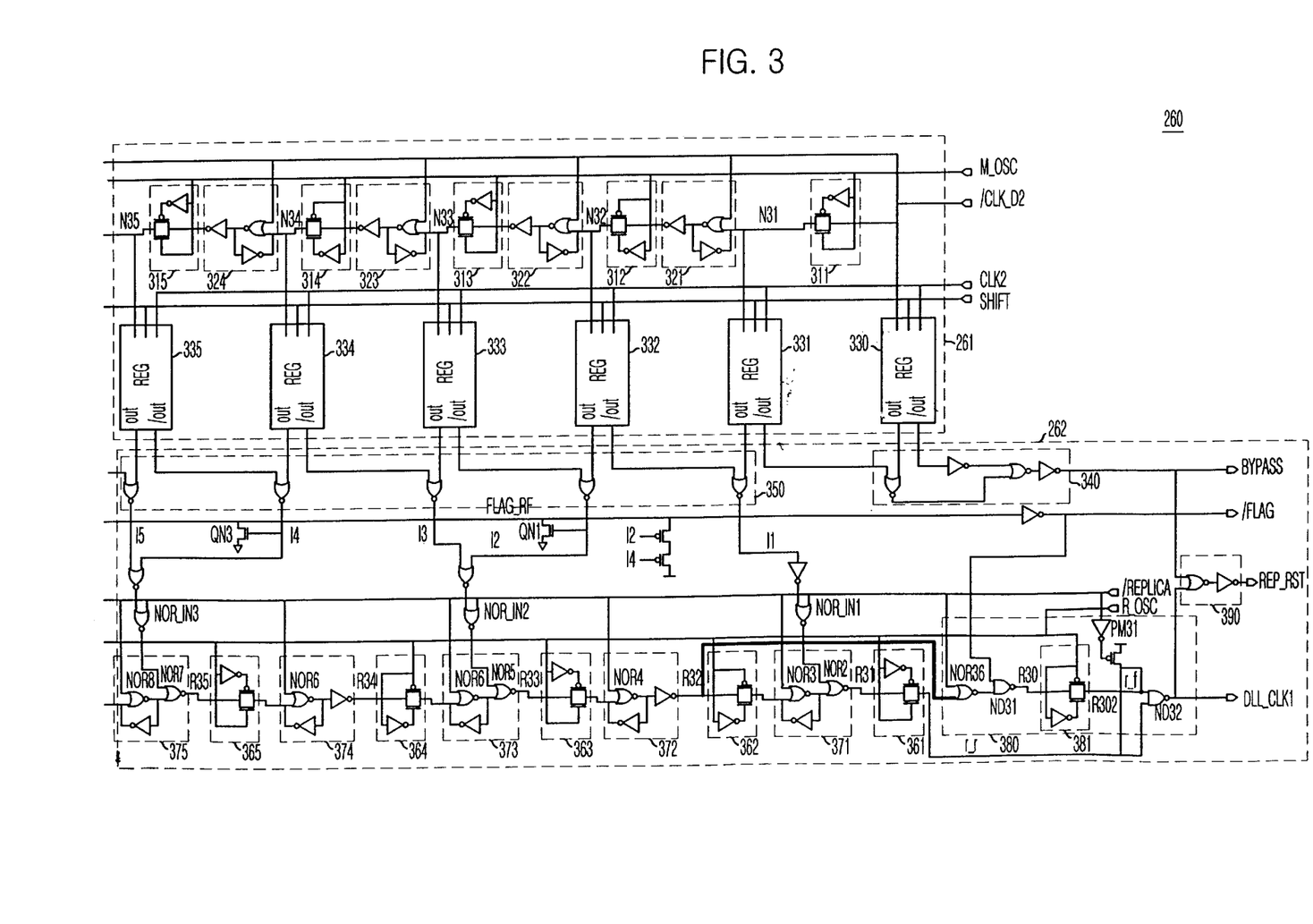
FIG. 3 is a circuit diagram illustrating a first delay unit shown in FIG. 2.

FIG. 3 is a circuit diagram illustrating the first delay unit 260 shown in FIG. 2.

Referring to FIG. 3, the first delay measurement unit 261 shifts a low level of the delayed control signal /CLK_D2 to measurement nodes N31 to N35 in response to the measurement oscillating signal M_OSC. Then, registers 331 to 335 store shifted low level of the measurement nodes N31 to N35 while the control clock signal CLK2 is a high level. The shifted low levels that are stored in the registers 331 to 335 are output to the first delay replication unit 262 in response to the control clock signal CLK2 and a shift control signal SHIFT.

In the first delay measurement unit 261, a plurality of first transfer control units 311 to 315 transfers the low level of the delayed control signal /CLK_D2 to the measurement nodes N31 to N35 in response to the measurement oscillating signal M_OSC.

Figure 7:
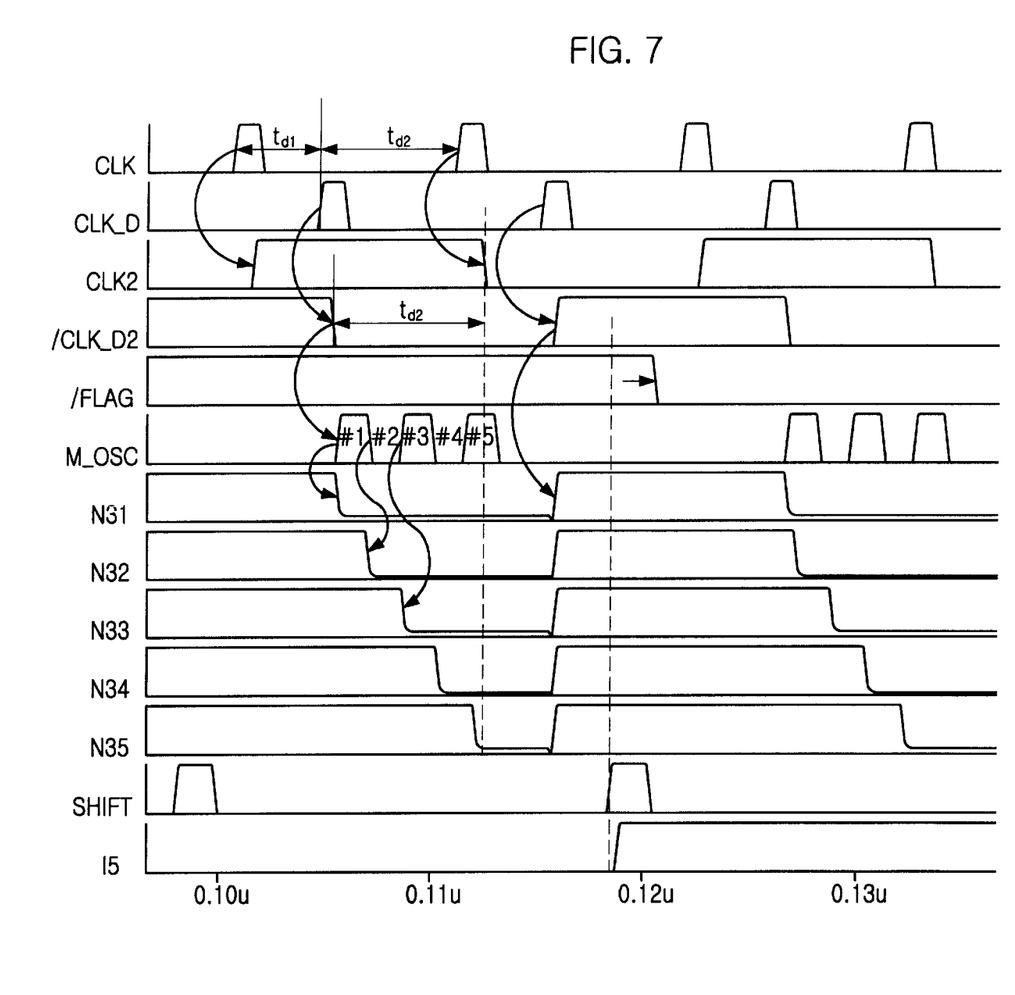
FIGS. 7 and 8 illustrate a timing chart of the first delay unit shown in FIG. 3.

The transition of the low level to each of the measurement nodes N31 to N35 is delayed because the first transfer control units 311 to 315 have switches which are alternately turned on/off by the same measurement oscillating signal M_OSC. As shown in FIG. 7, when the delayed control signal /CLK_D2 is in a low level and the measurement oscillating signal M_OSC goes to a first high level (#1), the measurement mode N31 shifts to a low level and other measurement nodes 32 to N35 are maintained at a high level. Accordingly, the low level transition point is transferred from node N31 to node N35.

As a result, in response to a logically combined signal of the delayed control signal /CLK_D2 and voltage levels on the measurement nodes N31 to N35, a plurality of second transfer control units 321 to 324 transfer the low levels of the measurement nodes N31 to N35 to the first transfer control units 311 to 315, respectively.

The registers 331 to 335 store the low level of the measurement nodes N31 to N35 in response to the delayed control signal /CLK_D2 and the shift control signal SHIFT.

Also, it should be noted that the registers 330 to 335 can receive the input signals only while the control clock signal CLK2 is at a high level. Accordingly, the number of transitions of the measurement oscillating signal M_OSC during the time period of $t_{d2}$ determines how many registers 331–335 store the logic low level. In this embodiment, the low level 'L' is transferred up to the register 335 as shown in FIG. 7. At this time, when the shift control signal SHIFT is activated, the registers 331 to 335 output high level signals through output terminals /OUT. Since the next stage (not shown) does not receive the low level signal, a locking signal I5 is at a high level and other locking signals I2 to I4 are at a low level. A flag signal /FLAG is activated when one of locking signals I1 to I5 (including I6, I7, . . . , in the next stages) is at a high level, as shown in FIG. 7. Such a flag signal /FLAG is used as an information signal to inform the second delay unit 270 of such a generation of the high level signal (I5). Generally, a logic summation circuit may be employed in digital circuits for detecting an input of a high level signal, such as the locking signal I5. As a result, the time, $t_{d2}$, is stored via nodes N31 to N35, and this signal processing is repeatedly performed every two periods of the external clock signal CLK.

Similar to other registers 331 to 335, a bypass register 330 stored a voltage level of the delayed control signal /CLK_D2 in response to the control clock signal CLK2 and outputs it in response to a high level signal of the shift control signal SHIFT.

In the first delay replication unit 262, a bypass signal generation unit 340 is enabled in response to an output signal of the bypass register 330 and an output signal of the register 331, thereby generating a bypass signal BYPASS.

In response to non-inverting/inverting signals of the registers 331 to 335, a delay determination unit 350 generates locking signals I1 to I5 to determining a degree of delay to be replicated.

A plurality of third transfer control units 371 to 375 transfer a predetermined voltage level to the replication nodes R31 to R35 in response to the locking signals I1 to I5, the replication signal /REPLICA and the replication oscillating signal R_OSC.

A plurality of fourth transfer control units 361 to 365 transfer each output signal of the third transfer control units 371 to 375 to next transfer control units.

When the replication signal /REPLICA is at a high level, all of the third transfer control units 371 to 375 are reset to a high level. When the replication signal /REPLICA is a low level signal, the low level signal is transferred to a NOR gate NOR7 because only the locking signal I5 is at a high level. At this time, when the replication oscillating signal R_OSC is toggled, the low level signal is transferred to the right. If this low level signal is transferred to node R32, one of two paths (r_r and r_f) is determined. When only the locking signal I5 is at a high level, and NAND gate ND31 is disabled because the flag signal /FLAG is at a low level. Accordingly, the low level signal is transferred on the path r_r (from r2 to r_r). If the locking signal I4 is at a high level, a NMOS transistor QN3 is turned on and the flag signal /FLAG is at a high level. The NAND gate ND31 is enabled so that the low level signal is transferred on the path r_f as well as the path r_r.

As mentioned above, an output unit 380 including a switch 381 and the NAND gate ND31 outputs the first delay clock signal DLL_CLK1 in response to the replication signal /REPLICA and the replication oscillating signal R_OSC.

The resolution in the first delay unit is determined by the interval between transitions of the oscillator. For example, if the transition interval of the oscillator is 2 ns, the first delay unit has a resolution of 2 ns.

Figure 4:
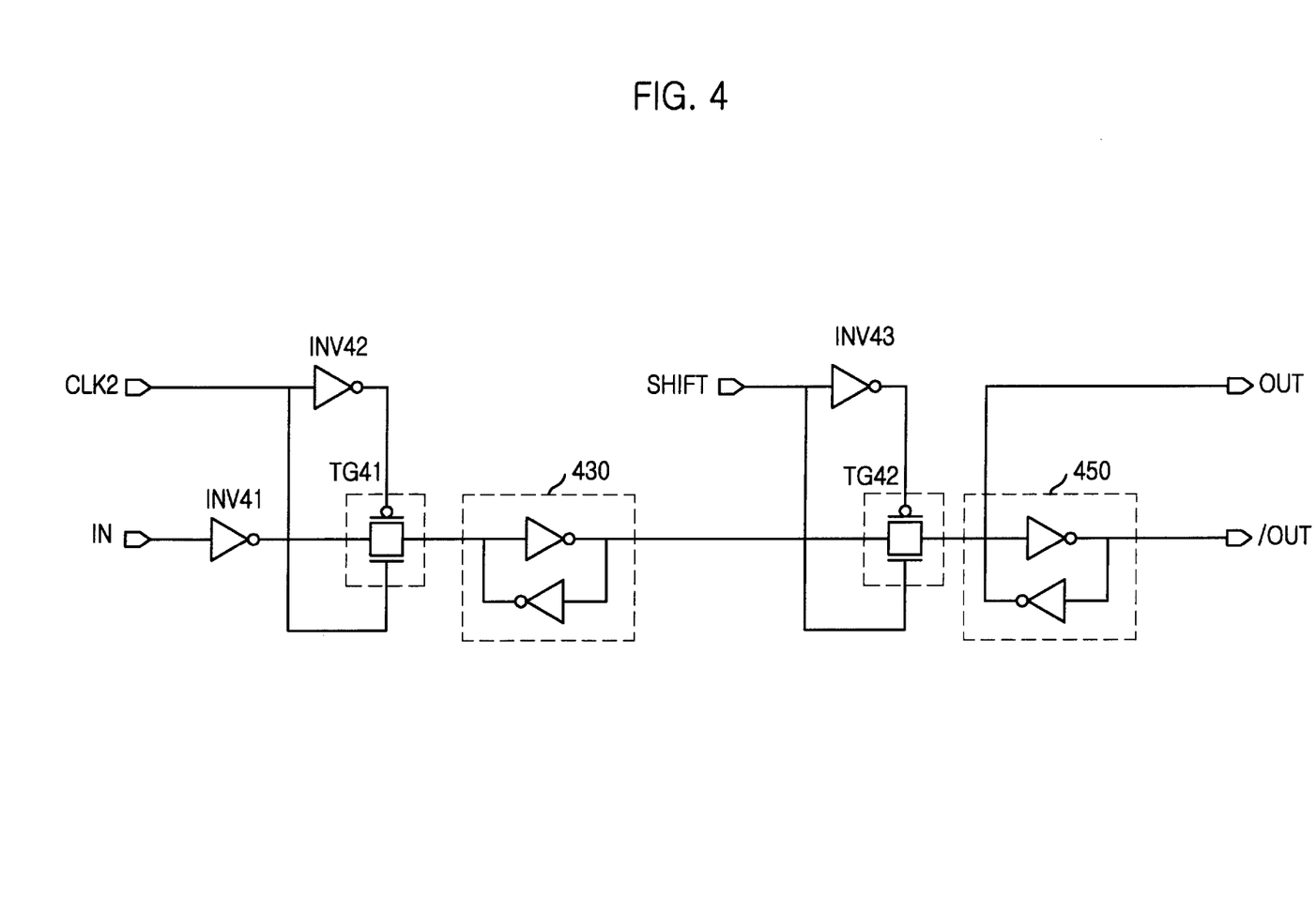
FIG. 4 is a circuit diagram illustrating a register shown in FIG. 3.

FIG. 4 is a circuit diagram illustrating the register shown in FIG. 3.

Referring to FIG. 4, each register 331 to 335 includes: a first transmission gate TG41 for transmitting a voltage level IN of each measurement node in response to the control clock signal CLK2; a first latch 430 for storing an output signal of the first transmission gate TG41; a second transmission gate TG42 for transmitting an output signal of the first latch 430 in response to the shift control signal SHIFT; and a second latch 450 for storing an output signal of the second transmission gate TG42 and outputting a non-inverting signal OUT and an inverting signal /OUT.

Figure 5:
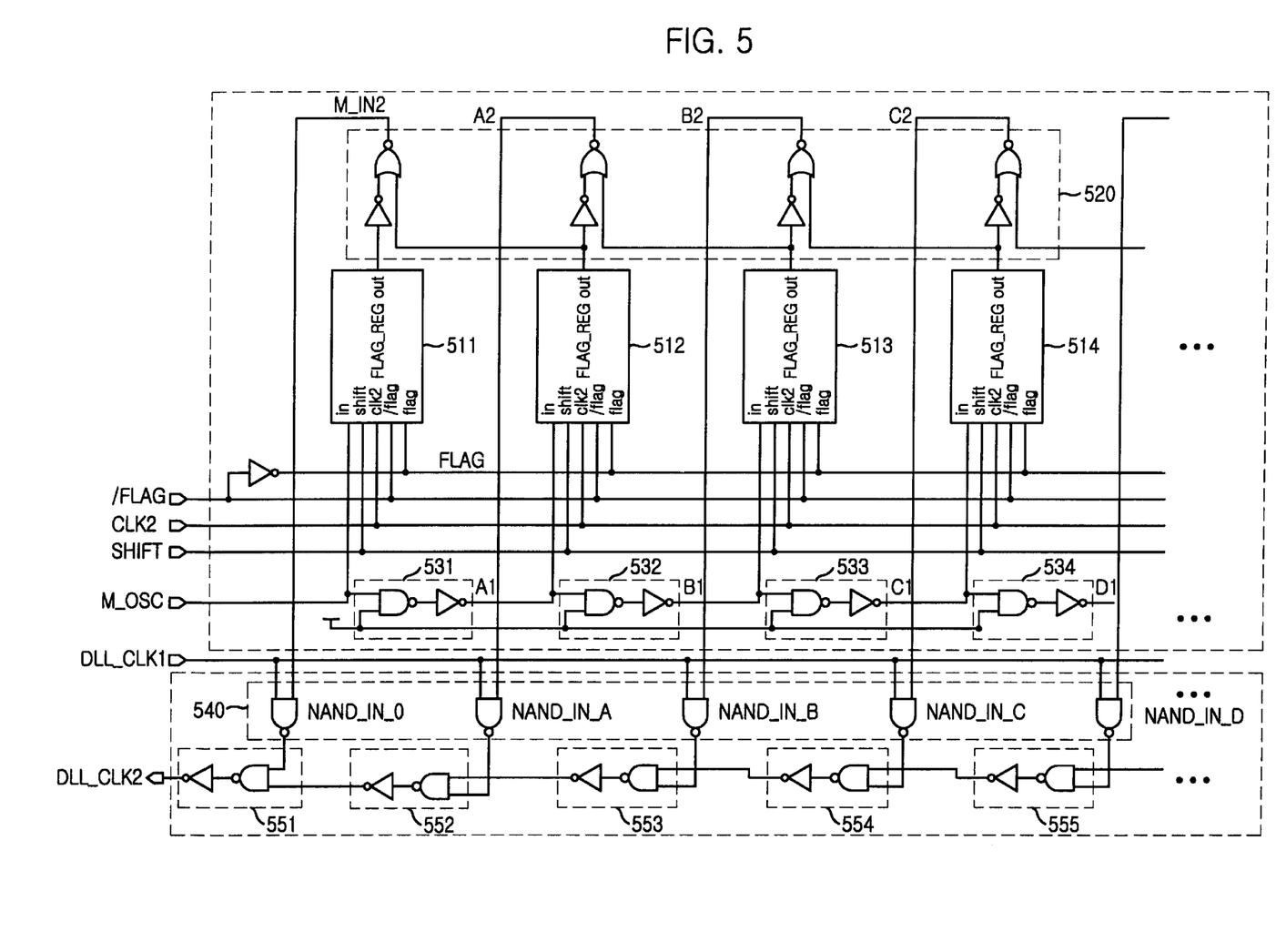
FIG. 5 is a circuit diagram illustrating a second delay unit shown in FIG. 2.

FIG. 5 is a circuit diagram illustrating the second delay unit 270 shown in FIG. 2.

Referring to FIG. 5, the second delay unit 270 includes the second delay measurement unit 271 for measuring a time to be finely delayed, and a second delay replication unit 272 for delaying the first delay clock DLL_CLK1 for a measured time to generate the second delay clock DLL_CLK2.

The second delay measurement unit 271 includes: a plurality of unit delay elements 531 to 534 for finely delaying the measurement oscillating signal M_OSC to generate delayed measurement oscillating signals A1, B1, C1 and D1; a plurality of flag registers 511 to 514 for storing the delayed measurement oscillating signals A1, B1, C1 and D1 in response to the flag signal FLAG, an inverted flag signal /FLAG, the control clock signal CLK2 and the shift control signal SHIFT; and an output unit 820 for receiving the output signals of the flag registers 511 to 514 to generate node signals M_IN2, A2, B2, C3.

The second delay replication unit 272 logically combines the node signals M_IN2, A2, B2, C3 and the first delay clock signal DLL_CLK1 to generate the second delay clock signal DLL_CLK2.

Figure 6:
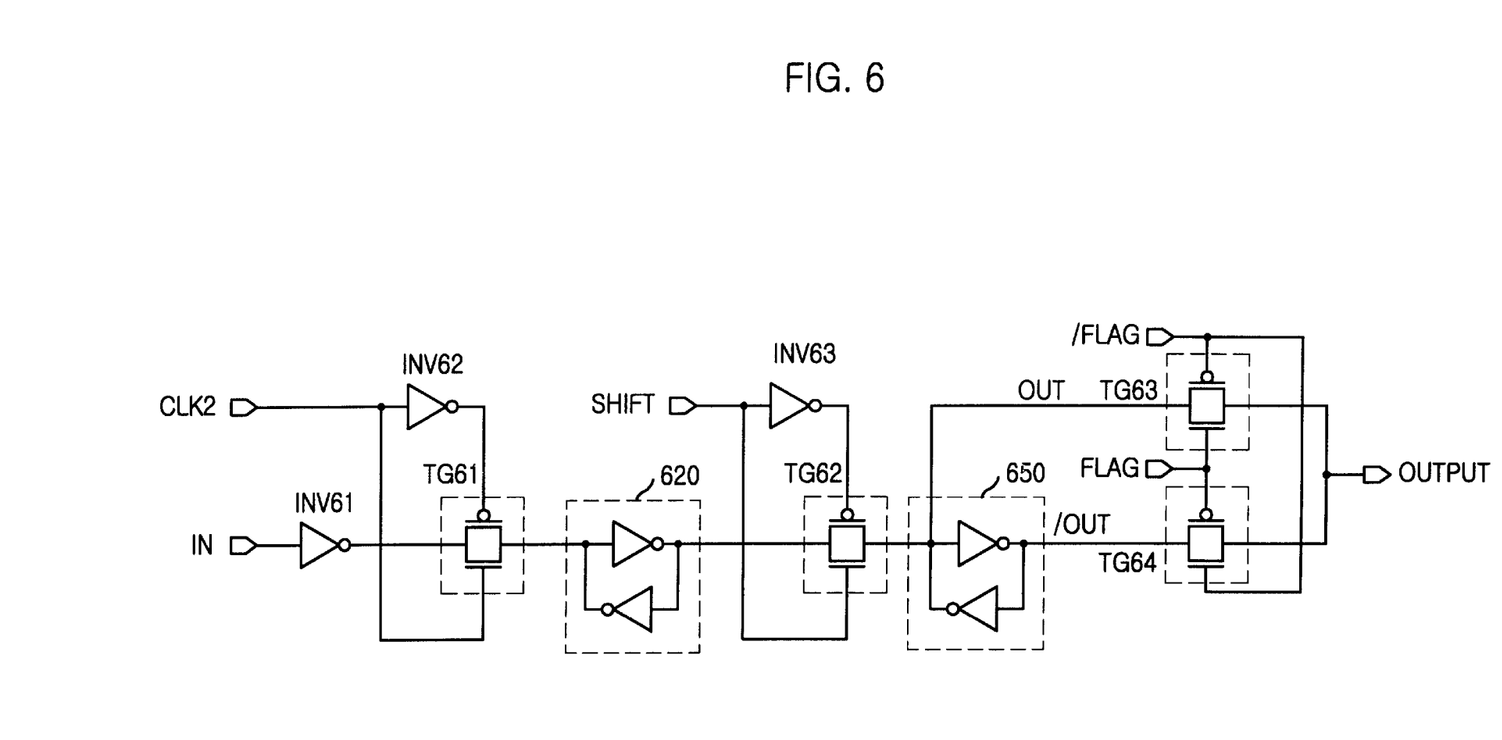
FIG. 6 is a circuit diagram illustrating a flag register shown in FIG. 5.

FIG. 6 is a circuit diagram illustrating the flag register shown in FIG. 5.

Referring to FIG. 6, each flag register includes: a first transmission gate TG61 for transmitting an inverted signal of the delayed measurement oscillating signal IN in response to the control clock signal CLK2; a first latch 630 for storing an output signal of the first transmission gate TG61; a second transmission gate TG62 for transmitting an output signal of the first latch 630 in response to the shift control signal SHIFT; a second latch 650 for storing an output signal of the second transmission gate TG62; a third transmission gate TG63 for outputting the output signal of the second transmission gate TG 62 in response to the non-inverting/ inverting flag signals FLAG and /FLAG; and a fourth transmission gate TG64 for outputting the output signal of the second latch 650 in response to the non-inverting/ inverting flag signals FLAG and /FLAG.

If the inverted flag signal /FLAG is activated, the flag register outputs the delayed measurement oscillating signal, and if the flag signal FLAG is activated, the flag register outputs an inverted signal of the delayed measurement oscillating signal.

Hereinafter, an operation of the delay circuit in accordance with the present invention will be described with reference to FIGS. 7 to 13.

Referring to FIG. 7, while the control clock signal CLK2 and the delayed control signal /CLK_D2 are respectively a low level and a high level, the oscillator 240 is disabled and the nodes N31 to N35 are reset to a high level.

The, while the control clock signal CLK2 and the delayed control signal /CLK_D2 is respectively a high level and a low level, the bypass register 330 stores a low level of the delayed control signal /CLK_D2, and the low level of the delayed control signal /CLK_D2 is sequentially shifted from the measurement node N31 to the measurement node N35 in response to the measurement oscillating signal M_OSC. As a result, the registers 331 to 335 store the shifted low levels.

If it is assumed that the low level is shifted to the node N335 while the control clock signal CLK2 is at a high level, the low level is stored from the register 331 to the register 335. Thus, only the locking signal I5 is at a high level and the other locking signals I1 to I4 are at a low level. Additionally, the inverted flag signal /FLAG becomes a low level.

Figure 8:
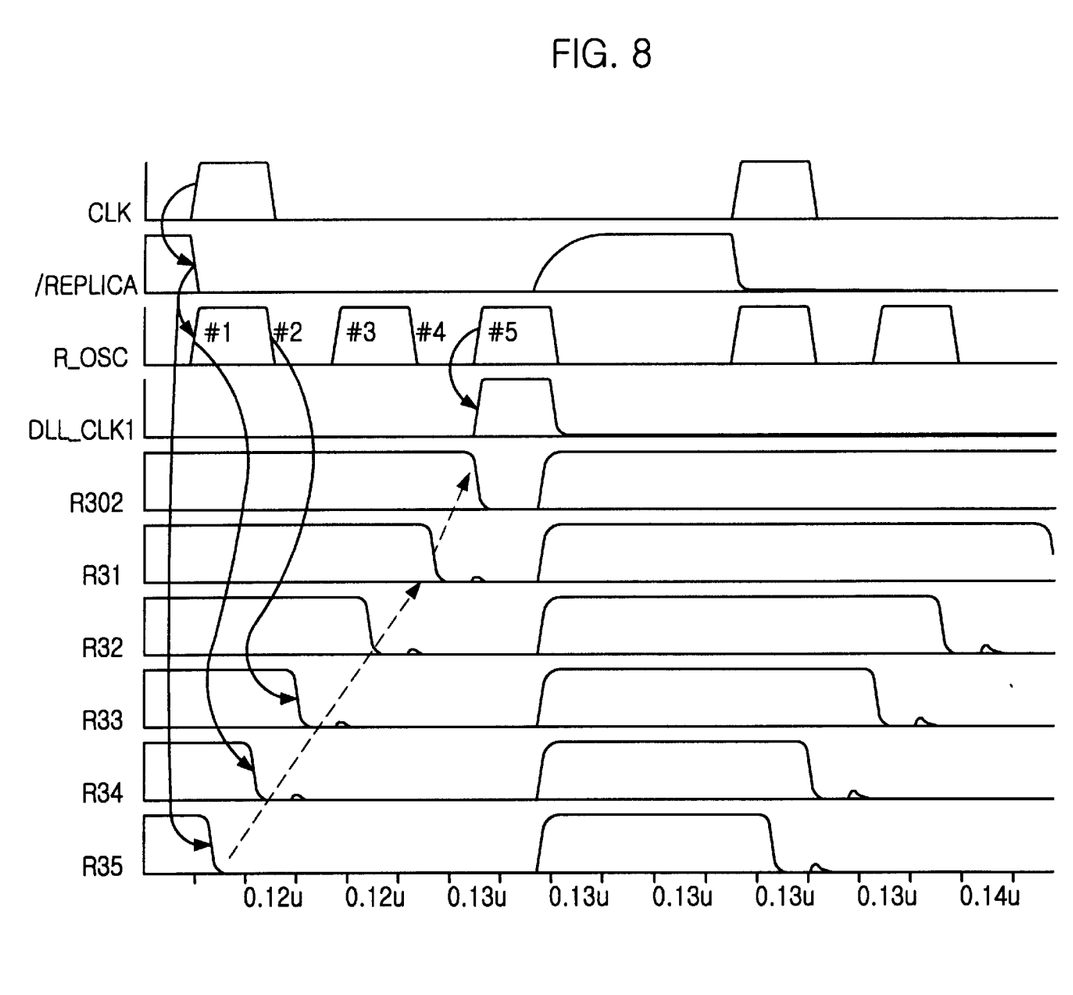

Referring to FIG. 8, if the replication signal /REPLICA is activated to a low level, the replication oscillating signal R_OSC is toggled so that the low level is sequentially transferred from the replication node to R35 to the node R31.

Since the inverted flag signal /FLAG is at a low level, the node R30 becomes a high level so that the first delay clock signal DLL_CLK is activated after a fifth transition of the replication oscillating signal R_OSC due to a voltage level of the node R31.

Figure 9:
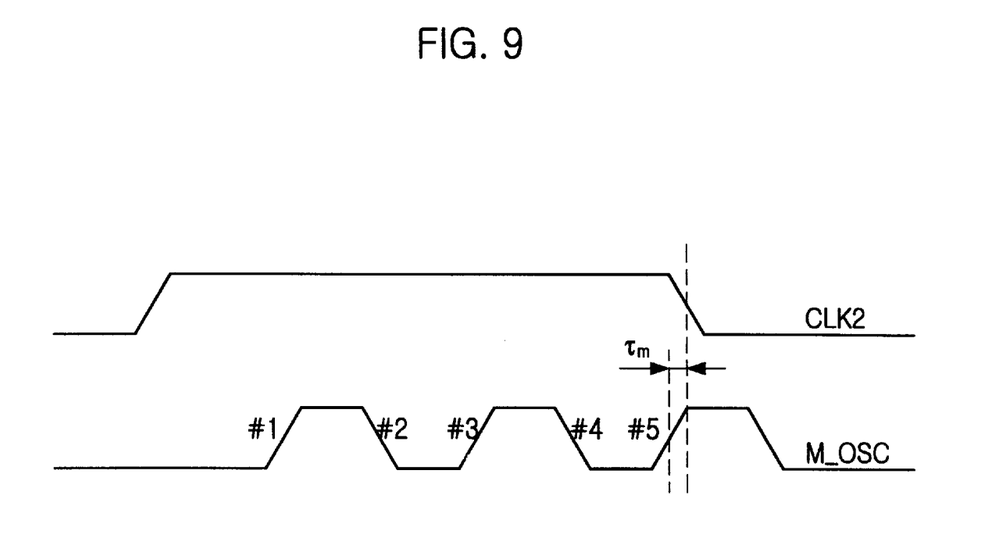
FIGS. 9 to 11 illustrate a timing chart of the second delay unit shown in FIG. 5.
Figure 10:
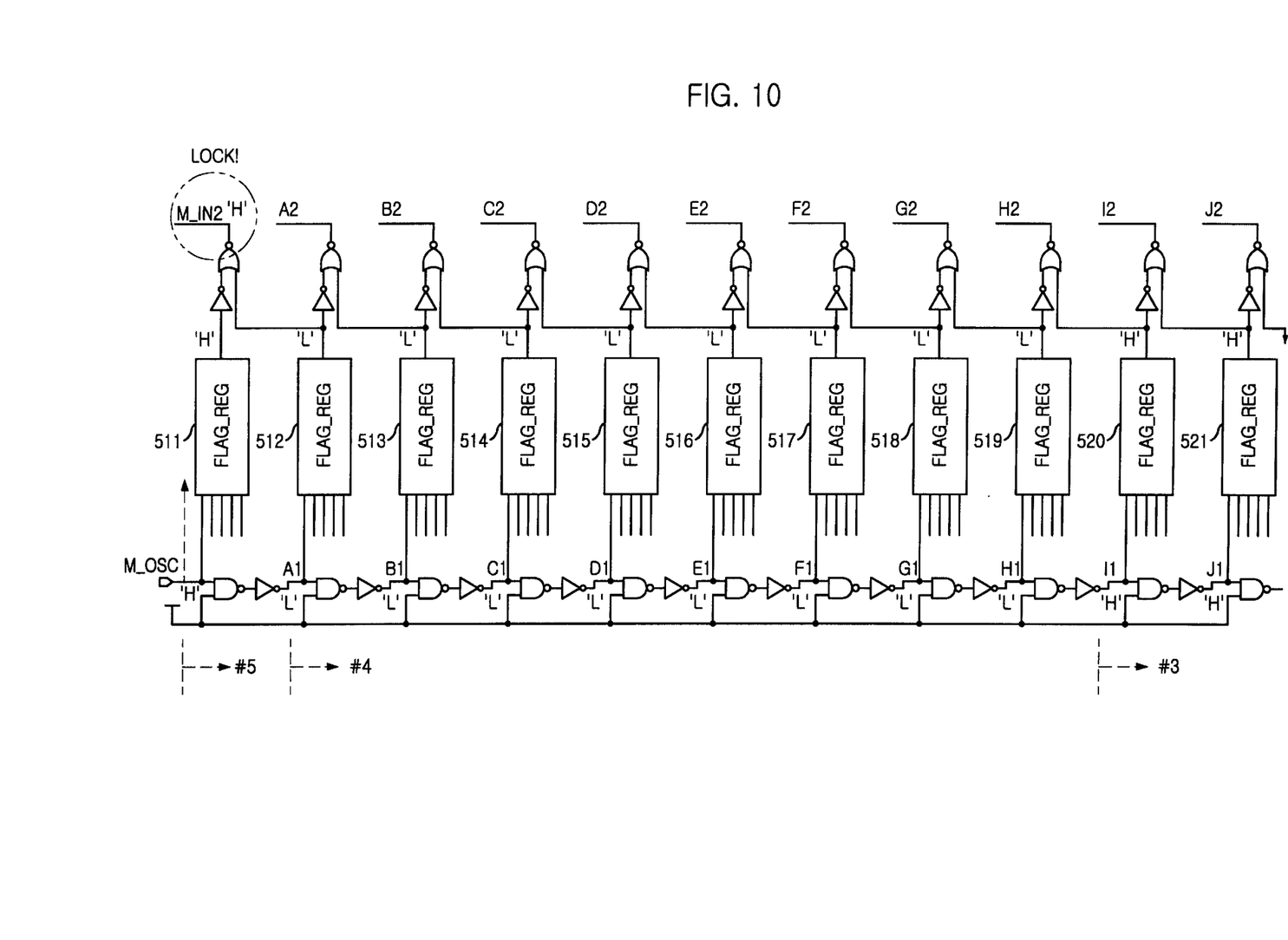

FIG. 9 illustrates a timing chart of the control signal CLK2 and the measurement oscillating signal M_OSC, and FIG. 10 illustrates a logic level of the second delay unit 270 in a case where the first delay unit 260 recognizes the fifth transition of the measurement oscillating signal M_OSC.

Referring to FIGS. 9 and 10, since the inverted flag signal /FLAG is activated to a low level, the flag registers 511 to 514 output a signal equal to the input signal. At this time, since the control clock signal CLK2 is disabled just before a high level at the fifth transition is transmitted, the node A1 is maintained at a low level and only a node M_IN2 becomes a high level. That is, a locking is accomplished at the node M_IN2.

Figure 11:
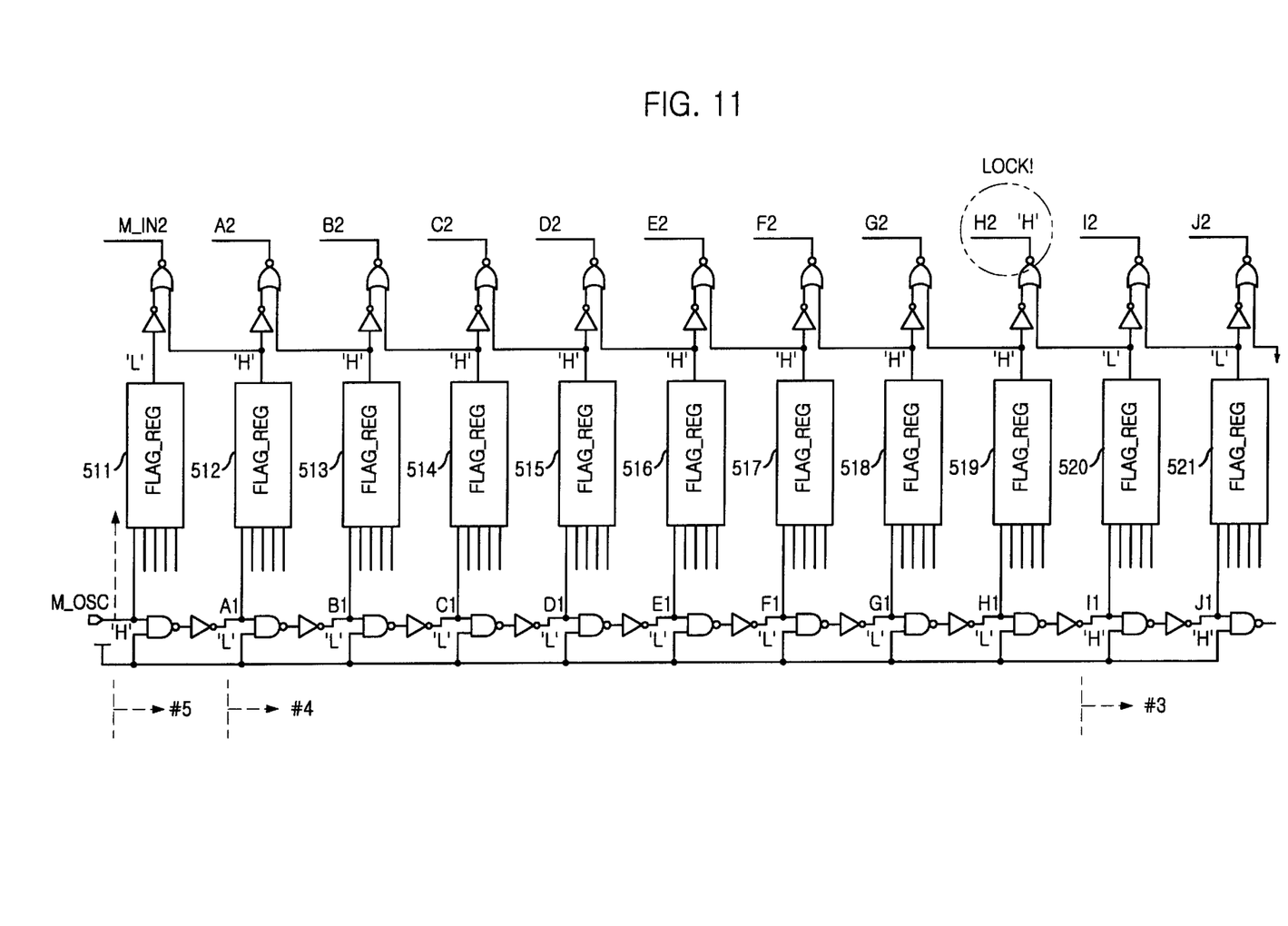

FIG. 11 illustrates a logic level of the second delay unit 270 in a case where the first delay unit 260 does not recognize the fifth transition of the measurement oscillating signal M_OSC.

Referring to FIG. 11, since the inverted flag signal is disabled at a high level, the flag registers output a signal opposite to the input signal. Accordingly, only a node H2 becomes a high level and the other nodes become a low level. That is, a locking is accomplished at the node H2.

Figure 12:
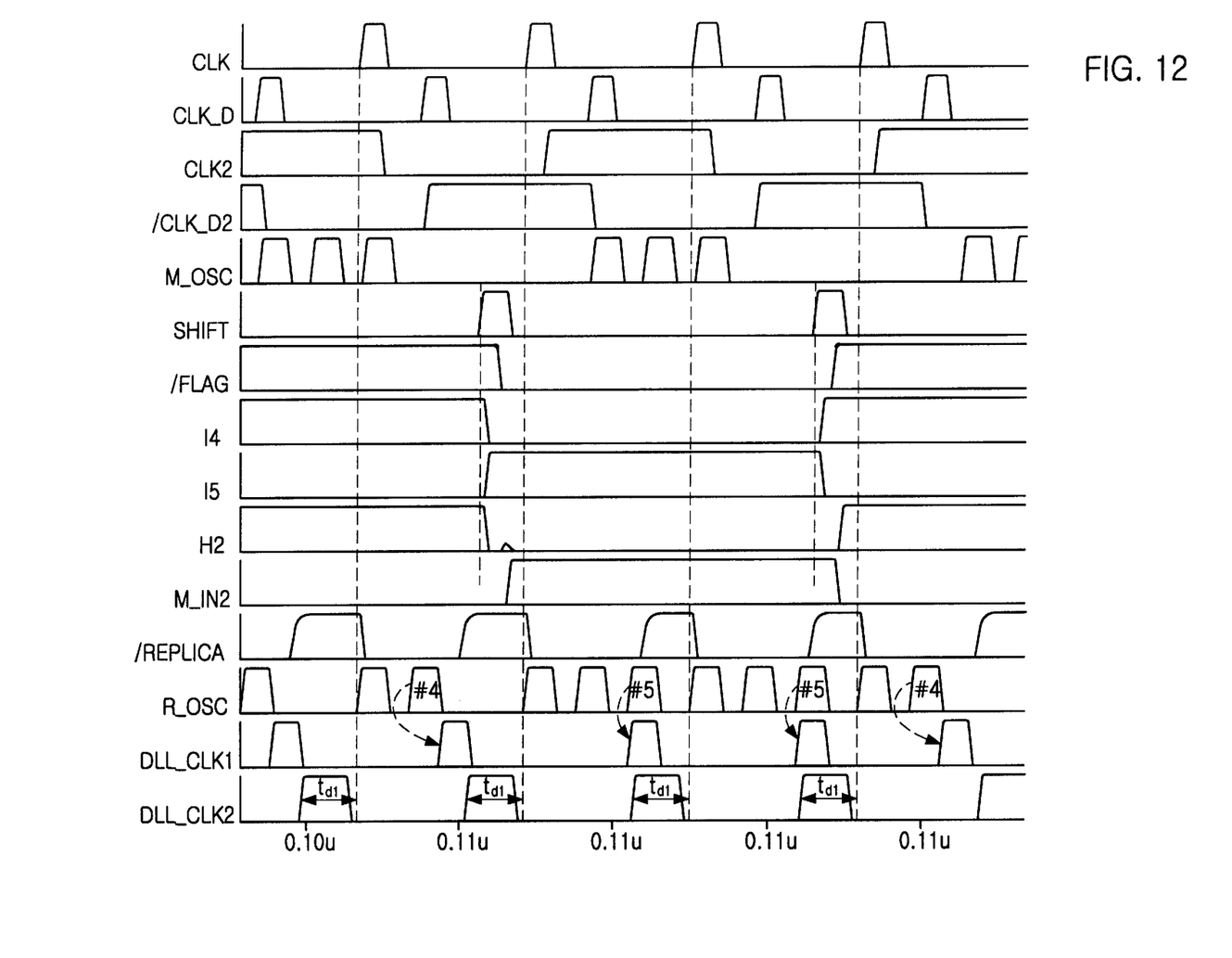
FIG. 12 illustrates an entire timing chart of the delay circuit in accordance with the present invention.

FIG. 12 illustrates an entire timing chart of the delay circuit in accordance with the present invention.

Referring to FIG. 12, if the first delay unit 260 recognizes the fifth transition of the measurement oscillating signal M_OSC, the first delay clock signal DLL_CLK1 is generated at the fifth transition. Meanwhile, if the first delay unit 260 does not recognize the fifth transition of the measurement oscillating signal M_OSC, the first delay clock signal DLL_CLK1 is generated at the fourth transition. However, since a position of the locking is changed according to the flag signal FLAG, it is possible to obtain a final delay clock signal, i.e., the second delay clock signal DLL_CLK, which precedes the external clock signal CLK by the skew $t_{d1}$.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay circuit for compensating for a skew in a synchronous dynamic random access memory, comprising:
   a delay model for delaying an external clock signal to generate a delayed clock signal;
   a signal generation means, responsive to the external clock signal and the delayed clock signal, for generating control signals, an internal clock signal, and a delayed internal clock signal;

a first delay means, responsive to the control signals, for delaying the delayed internal clock signal to generate a first delay locked clock signal, wherein the first delay means has a first amount of delay time; and a second delay means, responsive to the control signals, for delaying the first delay locked clock signal to generate a second delay locked clock signal, wherein the second delay means has a second amount of delay time, the second amount of delay time being shorter than the first amount of delay time, wherein the signal generating means includes:
  a control means, response to the external clock signal and the delayed clock signal, for generating control signals, wherein the control signals include a shift signal, a replication signal and a replication enable signal;
  a first oscillation means, responsive to the internal clock signal and the delayed internal clock signal, for generating a measurement oscillating signal; and
  a second oscillation means, responsive to the replication signal and the replication enable signal, for generating a replication oscillating signal.

2. The delay circuit as recited in claim 1, wherein the internal clock signal is enabled at a high level from a first rising edge to a second rising edge of the external clock signal.

3. The delay circuit as recited in claim 2, wherein the delayed internal clock signal is enabled at a low level from a first rising edge to a second rising edge of the internal clock signal.

4. The delay circuit as recited in claim 3, wherein the first delay means includes:
  a delay measurement unit for shifting a low level of the delayed internal clock signal in response to the measurement oscillating signal and storing the shifted low level; and
  a delay replication unit for generating the first delay locked clock signal in response to the replication oscillating signal.

5. The delay circuit as recited in claim 4, wherein the delay measurement unit includes:
  a plurality of first transfer control units, responsive to the measurement oscillating signal, for transferring the low level of the delayed internal clock signal to measurement nodes;
  a plurality of second transfer control units, responsive to a logically combined signal of the delayed internal clock signal, for transferring the low levels of the measurement nodes to the first transfer control units;
  a bypass register for storing a voltage level of the delayed internal clock signal in response to the internal clock signal and the shift signal; and
  a plurality of registers for storing the low level of the measurement nodes in response to the internal clock signal and the shift signal.

6. The delay circuit as recited in claim 5, wherein each of the registers includes:
  a first transmission gate for transmitting a voltage level of each measurement node in response to the internal clock signal;
  a first latch for storing an output signal of the first transmission gate;
  a second transmission gate for transmitting an output signal of the first latch in response to the shift signal; and
  a second latch for storing an output signal of the second transmission gate.

7. The delay circuit as recited in claim 5, wherein the delay replication means includes:
  a bypass signal generating unit for generating a bypass signal in response to an output signal of the bypass register and an output signal of a first register;
  a delay determination unit, responsive to the output signals of the registers, for generating locking signals for determining a degree of delay to be replicated;
  a plurality of third transfer control units, responsive to the locking signals, the replication signal and the replication oscillating signal, for transferring a predetermined voltage level to the replication nodes;
  a plurality of fourth transfer control units for transferring each output signal of the third transfer control units to neighboring transfer control unit; and
  an output unit for outputting the first delay locked clock signal in response to the replication signal and the replication oscillating signal.

8. The delay circuit as recited in claim 3, wherein the second delay means includes:
  a delay measurement unit for measuring a time to be delayed; and
  a delay replication unit for delaying the first delay locked clock signal for the measurement time to generate the second delay locked clock signal.

9. The delay circuit as recited in claim 8, wherein the delay measurement unit includes:
  a plurality of unit delay elements for delaying the measurement oscillating signal to generate delayed measurement oscillating signals;
  a plurality of flag registers for storing the delayed measurement oscillating signals in response to the internal clock signal, a flag signal and a shift control signal, wherein the flag signal is provided by the first delay means; and
  an output unit for receiving signals of the flag registers to generate node signals, each node signal being logically combined with the first delay locked clock signal.

10. The delay circuit as recited in claim 9, wherein each flag resister includes:
  a first transmission gate for transmitting an inverted signal of the delayed measurement oscillating signal in response to the internal clock signal;
  a first latch for storing an output signal of the first transmission gate;
  a second transmission gate for transmitting an output signal, of the first latch in response to the shift control signal;
  a second latch for storing an output signal of the second transmission gate;
  a third transmission gate for outputting the output signal of the second transmission gate in response to the flag signal; and
  a fourth transmission gate for outputting a signal stored in the second latch in response to the flag signal.

11. A delay circuit for compensating for a skew in a synchronous dynamic random access memory, comprising:
  a delay model for delaying an external clock signal to generate a delayed clock signal;
  a signal generation means for generating control signals, an internal clock signal, and a delayed internal clock signal in response to the external clock signal and the delayed clock signal, wherein the signal generation means includes first and second oscillators having the same configuration;

a first delay means, responsive to the control signals and to first and second oscillation signals from the first and second oscillators, for delaying the delayed internal clock signal to generate a first delay locked clock signal, wherein the first delay means determines an amount of delay time using the first and second oscillation signals and generates a flag signal indicating a first locking; and a second delay means, responsive to the flag signal, the internal clock signal, the shift signal, and the first oscillation signal, for delaying the first delay locked clock signal to generate a second delay locked clock signal, wherein the second delay means has an amount of delay time smaller than the first delay means.

* * * * *